(12) United States Patent
Su et al.

(10) Patent No.: US 6,251,744 B1
(45) Date of Patent: Jun. 26, 2001

(54) IMPLANT METHOD TO IMPROVE CHARACTERISTICS OF HIGH VOLTAGE ISOLATION AND HIGH VOLTAGE BREAKDOWN

(75) Inventors: Hung-Der Su, Kao-Hsiung; Chrong-Jung Lin, Hsin-Tien; Jong Chen, Taipei; Wen-Ting Chu, Kaoshiung; Hung-Cheng Sung, Hsin-Chu; Di-Son Kuo, Hsinchu, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/356,870

(22) Filed: Jul. 19, 1999

(51) Int. Cl.$^7$ ....................................................... H01L 21/76
(52) U.S. Cl. ........................ 438/400; 438/219; 438/302; 438/224
(58) Field of Search ...................................... 438/218, 223, 438/224, 228, 418, 420, 227, 302, 400–414, 423, 429, 225, 219, 277, 199, 237

(56) References Cited

U.S. PATENT DOCUMENTS

| 5,393,679 | * | 2/1995 | Yang | 438/217 |
| 5,501,993 | | 3/1996 | Borland. | 437/34 |
| 5,693,505 | | 12/1997 | Kobayashi | 437/154 |
| 5,821,589 | | 10/1998 | Borland | 257/369 |
| 5,866,458 | | 2/1999 | Lee | 438/277 |

* cited by examiner

Primary Examiner—Charles Bowers
Assistant Examiner—Yennhu B. Huynh
(74) Attorney, Agent, or Firm—George O. Saile; Stephen B. Ackerman

(57) ABSTRACT

A layer of well oxide is grown over the n-well or p-well region of the semiconductor substrate. A deep n-well implant is performed in high voltage device region, followed by a deep n-well drive-in of the deep n-well implant. The well oxide is removed; the field oxide (FOX) region is created in the high voltage device region. A layer of sacrificial oxide is deposited on the surface of the semiconductor substrate. A low voltage cluster n-well implant is performed in the high voltage PMOS region of the semiconductor substrate followed, for the high voltage NMOS region, by a low voltage cluster p-well implant which is followed by a buried p-well cluster implant.

24 Claims, 4 Drawing Sheets

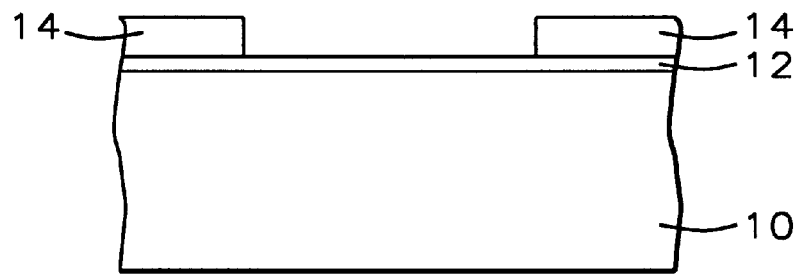
*FIG. 1 - Prior Art*
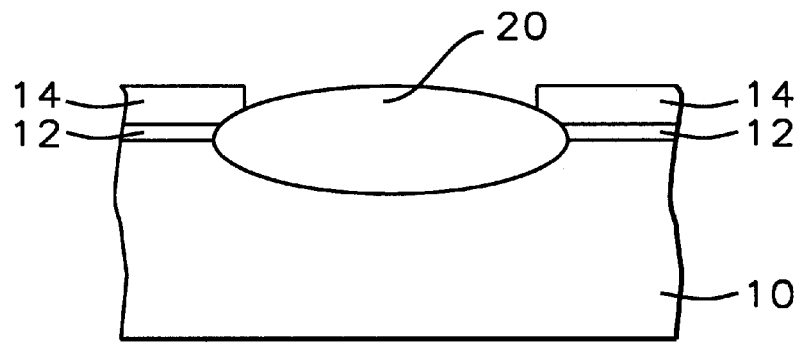
*FIG. 2 - Prior Art*
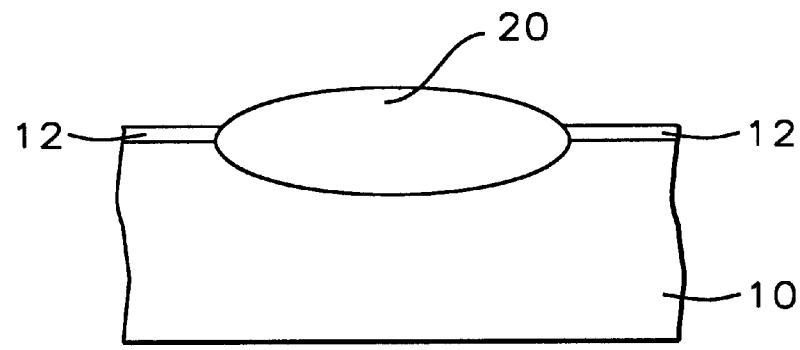
*FIG. 3 - Prior Art*

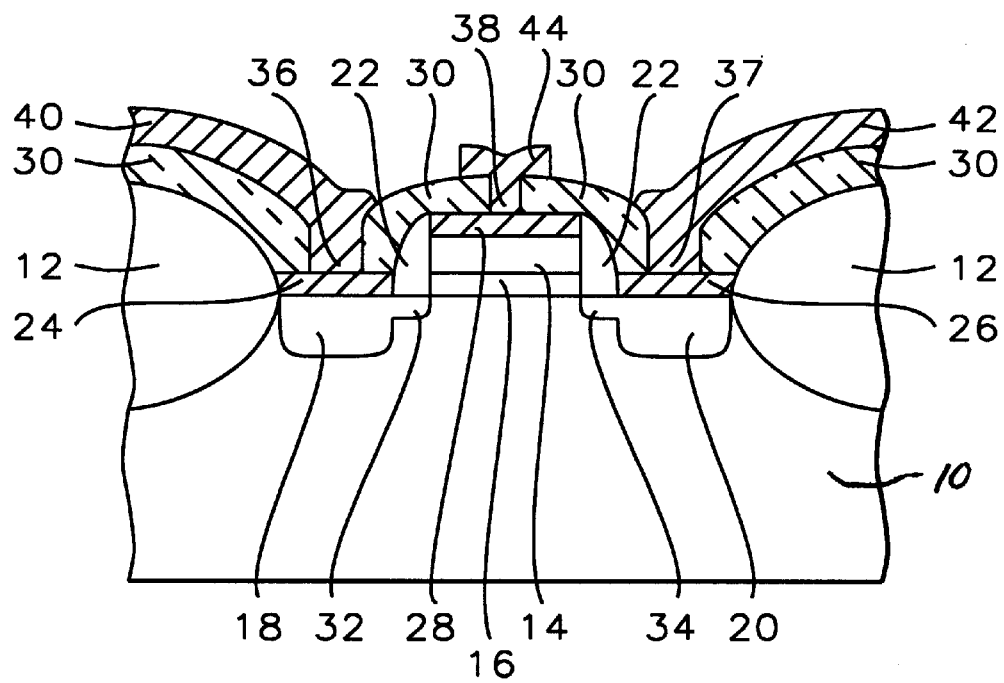
FIG. 4 - Prior Art
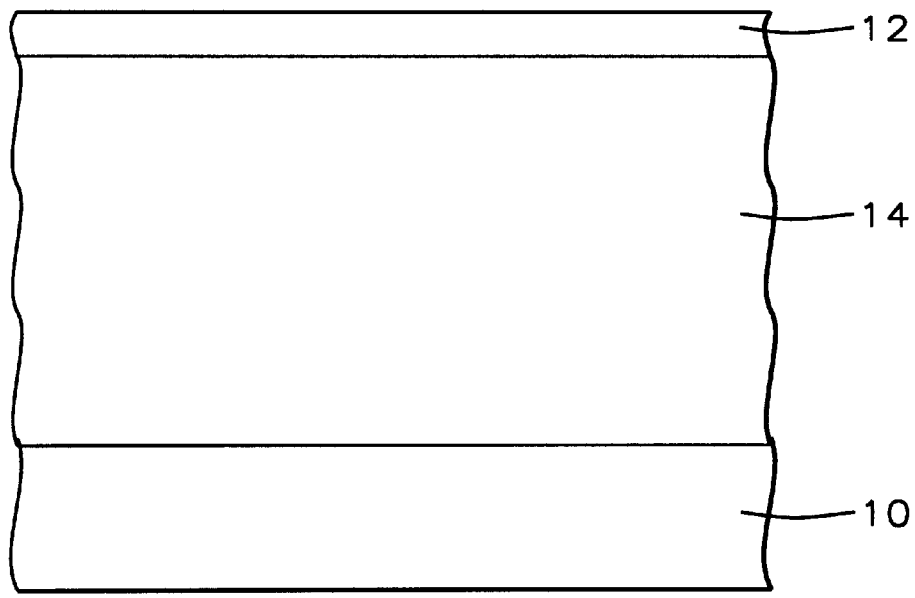
FIG. 5

IMPLANT METHOD TO IMPROVE CHARACTERISTICS OF HIGH VOLTAGE ISOLATION AND HIGH VOLTAGE BREAKDOWN

BACKGROUND OF THE INVENTION (1) Field of the Invention

The invention relates to the field of semiconductor manufacturing, and more specifically to a novel method of performing NWELL and PWELL implantation that avoids decreasing the breakdown voltage for high voltage devices.

(2) Description of the Prior Art

The rapid evolution of integrated circuits imposes on the semiconductor industry the necessity of creating an efficient and reliable process to separate active devices that function on the current miniaturized scale is. Semiconductor devices are being formed on the silicon substrates of integrated circuits at increasingly higher device densities and smaller feature sizes. The rapid process of device miniaturization and the therefrom following increased density of semiconductor devices presenting new problems of semiconductor device design and manufacturing.

In a CMOS type semiconductor device, one of the devices is formed in either a p-well region or in an n-well region. Single well structures have the disadvantage that impurity concentration in the well region is too high resulting in a decrease of the device operating speed. For high speed operating devices, it is therefore required that the device is fabricated having a twin well structure whereby both p-well and n-well regions are formed in the substrate and both well regions have low impurity concentrations. Optimizing impurity concentrations for the n and p-well regions must in this case optimize device performance.

During operation of a CMOS device, a latch-up occurs in the CMOS device during which a parasitic thyristor is turned on that is derived from the structure of the CMOS device. This occurrence causes an excessive amount of current to flow through the CMOS device causing rapid detonation of device operation to the point where device damage or destruction can occur. To reduce the possibility of this CMOS device thyristor effect, a retrograde well structure is often employed where a well layer has a deep region that has an impurity concentration that is higher than other regions of impurity concentrations. This approach in effect controls the resistance in the deep well region thereby reducing the thyristor switch on effect.

CMOS devices created with micron and sub-micron device features are subject to problems of source to drain region punch-through (most notably occurring in short channel MOSFET devices), the above indicated latch-up of a CMOS device in addition to degradation of insulating characteristics due to punch-through between devices. The problem of source/drain punch-through has typically been resolved by performing a punch-through-stop ion implantation in the device substrate prior to the formation of the CMOS device gate electrode. This ion implant is performed prior to forming the field oxide for the gate electrode.

The indicated processing steps of ion implantation significantly add to the device fabrication complexity and cost. Device performance can also be degraded due to such phenomenon as increased impurity concentration in MOSFET channel regions, reduced carrier mobility due to higher carrier concentrations in critical device regions, increased junction capacitance, the encroachment of impurities from the field regions to the active regions of the device and increased threshold voltage of the device.

To isolate individual devices when creating MOS type circuits, the threshold voltage for the field-oxide areas must be high. To establish this high threshold voltage, special isolation techniques are applied, among these isolation techniques are the LOCOS process, polybuffered LOCOS and shallow trench isolation.

The most widely used method for creating isolation in NMOS and PMOS integrated circuits is the basic LOCOS structure. In the LOCOS approach, a layer of oxide is selectively grown over the field regions of the IC. This is done by covering the active regions with a thin layer of silicon nitride. When the field oxide is grown, the active regions remain covered by nitride, which prevents oxidation of the silicon beneath. In the field regions the surface of the silicon substrate is exposed prior to field oxidation by etching away the nitride layers in these areas. In addition, the silicon in these regions is also selectively implanted at this point with the channel-stop dopant. Thus, the channel-stop regions become self-aligned to the field oxide.

If the field oxide is selectively grown without etching the silicon, the resulting field oxide will be partially recessed. If, on the other hand, the silicon is etched after the oxide-preventing layer is patterned, the field oxide can be grown until it forms a planar surface with the silicon substrate. This is known as the fully recessed isolation oxide process. In the semi-recessed process, the height of the oxide protruding above the level of the active region surface is larger than in the fully recessed process, but it is smaller than in the grow-oxide-and-etch process. In addition, the semi-recessed oxide step has a gentle slope that is more easily covered by subsequent polysilicon and metal layers.

The conventional LOCOS isolation process has a problem known as "bird's beak encroachment" and is therefore limited to a scalability within about the 1 um range.

The LOCOS process than uses the property that oxygen diffuses through $Si_3N_4$ very slowly. When silicon is covered with silicon nitride no oxide can grow. In addition, nitride itself oxidizes at a very slow rate and will thus remain as an integral oxidation barrier layer throughout the entire oxidation step.

FIGS. 1 through 3 show Prior Art LOCOS processing steps.

FIG. 1 shows, how, after a wafer 10 with a bare silicon surface is cleaned, a 20 to 60 nm. layer 12 of $SiO_2$ is thermally grown on its surface. Next, a 100 to 200 nm.-thick layer 14 of Chemical Vapor Deposition (CVD) silicon nitride $Si_3Ni_4$, which functions as an oxidation mask, is deposited. The active regions are then defined with a photolithographic step so that they are protected by the photoresist patterns. The composite oxide/nitride layers are then plasma-etched as a stack. With the photoresist pattern in place, the wafer is subsequently implanted with a $10^{12}$ to $10^{13}$ cm$^{-2}$ dose of boron with energies in the range of 60 to 100 keV. This channel stop is now self-aligned to the n-channel devices. The underlying layer of oxide within the stack, called a pad or buffer oxide, is used to cushion the transition of stresses between the silicon substrate and the nitride film.

FIG. 2 shows how, after the channel stop implant, the field oxide 20 with a thickness of 400 to 900 nm. is thermally grown by wet oxidation at temperatures of 900 to 1000 degrees C. for 4 to 8 hours.

FIG. 3 shows the next stage of the processing sequence, the masking nitride layer is stripped with phosphoric acid at 180 degrees C. using a reflux boiler. Then the pad oxide is etched (not shown).

Another method used for establishing device isolation is the use of Shallow Trench Isolation (STI). STI can be made using a variety of methods. For instance, one method is the Buried Oxide (BOX) isolation used for shallow trenches. The method involves filling the trenches with a chemical vapor deposition (CVD) silicon oxide (SiO$_2$) and then etched back or mechanically/chemically polished to yield a planar surface. The shallow trenches etched for the BOX process are anisotropically plasma etched into the silicon substrate and are typically between 0.3 and 0.8 micrometer (um.) deep. STI are formed around the active device to a depth between 3000 and 20000 Angstrom.

A further consideration in forming CMOS devices is how the substrates will be formed for the two types of transistors. For n-channel type transistors, a p-substrate is required while for p-type transistor an n-substrate is required. This leads to three different approaches in forming the two different types of substrates, that is the p-well, n-well and twin-well approach.

For the n-well process, an n-well is formed in a p-type substrate. This process involves implanting an n-type dopant into a p-substrate whereby the dopant concentration must be high and high enough that the p-substrate is overcompensated such that good control of the n-type doping is achieved. This assures that, because the concentration of the p-substrate dopant is high, the device characteristics can be well established for the n-channel device. In order to assure this control, the n-well dopant typically is in the order of five to ten times higher than that of the p-substrate. This extreme level of doping however has negative effects in the p-channel transistor due to the extreme concentration of dopant. These negative effects include increased back-gate bias sensitivity, reduction of molecular mobility and increased internal device capacitance.

A process similar to the process described above for the n-well can be applied to create the p-well. The p-well created in this similar manner also suffers the negative effects of the p-well overcompensating of the n-substrate as a consequence of which the n-channel transistor suffers from excessive doping effects.

FIG. 4 gives an overview of a MOSFET device. The process of creating a MOSFET device starts with the surface of a semiconductor substrate 10, FIG. 4. Forming insulation regions that bound the active region isolates the active region that is to be used for the creation of the gate electrode. Field Oxide (FOX) isolation regions 12 can be used to electrically isolate the device. A thin layer of gate oxide is grown over the surface of the substrate 10 on the active device region. To create the gate structure, a layer of polysilicon is grown over the thin layer of gate oxide. The polysilicon layer is masked and the exposed polysilicon and the thin layer of oxide are etched to create the polysilicon gate 14 that is separated from the substrate by the remaining thin layer of oxide 16. The doping of the source/drain regions starts with creating the lightly N$^+$ doped diffusion (LDD) regions 32/34. The sidewall spacers 22 for the gate structure are formed after which the source and drain region doping is completed by doping the source/drain regions 18/20 to the desired level of conductivity using a N$^+$ dopant.

Contact points to the source/drain regions and the electrode gate are then formed by first selectively depositing a layer of titanium over the surface of the source/drain regions and the top surface of the gate electrode. This titanium is annealed causing the deposited titanium to react with the underlying silicon of the source/gain regions and the doped surface of the gate electrode. This anneal forms layers of titanium silicide 24/26 on the surfaces of the source/drain regions and layer 28 on the top surface of the gate electrode.

The metal contacts with the source/drain regions and the gate electrode are formed as a final step. A dielectric 30 such as silicon oxide is blanket deposited over the surface of the created structure, patterned and etched to create contact openings 36/37 over the source/drain regions and opening 38 over the top surface of the gate electrode. The metalization layer selectively deposited over the patterned dielectric establishes the electrical contacts 40/42 with the source/drain regions and 44 with the top surface of the gate electrode.

Using conventional implantation processes, the p-field implant is performed simultaneously into the active region and into the device isolation (field) region of the device. This approach decreases the breakdown voltage of the device since the p-field implant at the interface between the source/drain junction and the LOCOS (field oxide) region increases the well concentration of the junction edge resulting in a decrease of the breakdown voltage of the device.

For future processing step of p-field implant, these two simultaneous processing steps of implant are divided into two separate steps of implantation, that is a retrograde implant is first used for the device p-field well implant while device STI is used for device isolation.

U.S. Pat. No. 5,866,458 (Lee) shows a CMOS device with N and P regions under a FOX.

U.S. Pat. No. 5,821,589 (Borland) and U.S. Pat. No. 5,501,993 (Borland) disclose several cluster I/I under FOX regions.

U.S. Pat. No. 5,693,505 (Kobayashi) shows a method that I/I several regions and wells under FOX's.

U.S. Pat. No. 5,393,679 (Yang) teaches a double charge I/I for a retrograde process.

SUMMARY OF THE INVENTION

It is the primary objective of the invention to improve high voltage isolation characteristics of isolation regions in a semiconductor device.

It is a further objective of the invention to increase the high voltage breakdown voltage of isolation regions in a semiconductor device.

It is a further objective of the invention to increase the value of the voltage that causes voltage punch-through through isolation regions within a semiconductor device.

It is a further objective of the invention to combine retrograde well implant with Shallow Trench Isolation within a semiconductor structure.

It is a further objective of the invention is to introduce a low voltage well structure into the high voltage region thereby saving one (PFIELD) masking step.

It is a further objective of the invention to simplify the construction of isolation regions within a semiconductor structure by introducing a one-mask step construction of a low voltage well structure within the high voltage region.

It is another objective of the invention to convert the low voltage well structure from a full well structure to a structure of reduced-height or pullback structure.

It is a further objective of the invention to improve the field turn-on characteristics of a device by providing a highly doped region under the field region of the device.

It is a further objective of the invention to avoid well punch-through of a device by providing a highly doped region under the field region of the device.

In accordance with the objectives of the invention, a new method of forming an improved device isolation area is achieved.

Under the first embodiment of the invention a layer of well oxide is grown over the n-well region of the semiconductor substrate. An n-well implant is performed in the n-well region, followed by a deep n-well drive-in of the n-well implant. The well oxide is removed from the surface of the semiconductor substrate; the field oxide (FOX) region is created in the semiconductor substrate in the n-well region. A layer of sacrificial oxide is deposited on the surface of the semiconductor substrate. As a final step under the first embodiment of the invention a low voltage cluster n-well implant is performed in the n-well region of the semiconductor substrate.

Under the second embodiment of the invention a layer of well oxide is grown over the p-well region of the semiconductor substrate. An n-well implant is performed in the p-well region, followed by a deep n-well drive-in of the n-well implant. The well oxide is removed from the surface of the semiconductor substrate; the field oxide (FOX) region is created in the semiconductor substrate in the p-well region. A layer of sacrificial oxide is deposited on the surface of the semiconductor substrate. A low voltage p-well cluster implant is performed in the p-well region of the semiconductor substrate followed by, as a final step under the second embodiment of the invention, a buried p-well cluster implant in the p-well region of the semiconductor substrate.

BRIEF DESCRIPTION OF THE DRAWINGS

FIG. 1 shows a cross section of a Prior Art semiconductor substrate on which a layer of silicon has been deposited and a patterned layer of silicon nitride has been created.

FIG. 2 shows a cross section of a Prior Art semiconductor substrate on which a channel stop implant has been performed and the field oxide has been grown.

FIG. 3 shows a cross section of a Prior Art semiconductor substrate with the field oxide and from which the silicon nitride has been removed.

FIG. 4 gives an overview of a MOSFET device.

FIGS. 5 through 7 address the first embodiment of the invention, as follows:

FIG. 5 shows the cross section of a n-well region of a semiconductor substrate on the surface of which a layer of well oxide has been deposited and into which a deep n-well implant followed by a deep n-well drive-in have been performed.

FIG. 6 shows the cross section of the n-well region of the semiconductor substrate of FIG. 5 from the surface of which the layer of well oxide has been removed, followed by the creation of a field oxide region, followed by the growth of a layer of sacrificial oxide on the surface of the semiconductor substrate.

FIG. 7 shows the cross section of the n-well region of the semiconductor substrate of FIG. 6 into which a low voltage n-well cluster implant has been performed.

FIG. 8 shows the cross section of a buried p-well region of a semiconductor substrate on the surface of which a layer of well oxide has been deposited and into which a deep n-well implant followed by a deep n-well drive-in have been performed.

FIG. 9 shows the cross section of the p-well region of the semiconductor substrate of FIG. 8 from the surface of which the layer of well oxide has been removed, followed by the creation of a field oxide region, followed by the growth of a layer of sacrificial oxide on the surface of the semiconductor substrate.

FIG. 10 shows the cross section of the p-well region of the semiconductor substrate of FIG. 9 into which a low voltage p-well cluster implant has been performed followed by a buried p-well cluster implant.

DESCRIPTION OF THE PREFERRED EMBODIMENTS

Referring now specifically to FIG. 5, there is shown a cross section of an n-well region of a semiconductor substrate 10. A layer 12 of well oxide has been deposited on the surface of the semiconductor substrate 10, the region 14 of the deep n-well after the deep n-well implant and deep n-well drive-in have been performed on the semiconductor substrate has been indicated.

Well oxide is usually formed as a silicon dioxide material but may be a composite oxide, such as TEOS and silicon dioxide, or a nitride oxide layer or a like gate dielectric. The well oxide layer is deposited using LPCVD, PECVD, or APCVD processing, at a temperature between about 300 and 800 degrees C., to a thickness between about 200 and 5000 Angstrom.

A well implant provides a more uniform background doping. Typical n-well implant processing conditions are as follows:

N-well implant: P
  energy: 100 KeV to 5 Mev
  dose: 5E11 to 1E13 atoms/cm$^2$.

The deep n-well drive-in is performed under processing conditions of a temperature between about 1000 and 1200 degrees C. for a time of between about 6 and 24 hours in a environment of $N_2$ gas. The n-well typically penetrates to a depth under the surface of the substrate between about 3 and 6 um.

Figure 6:
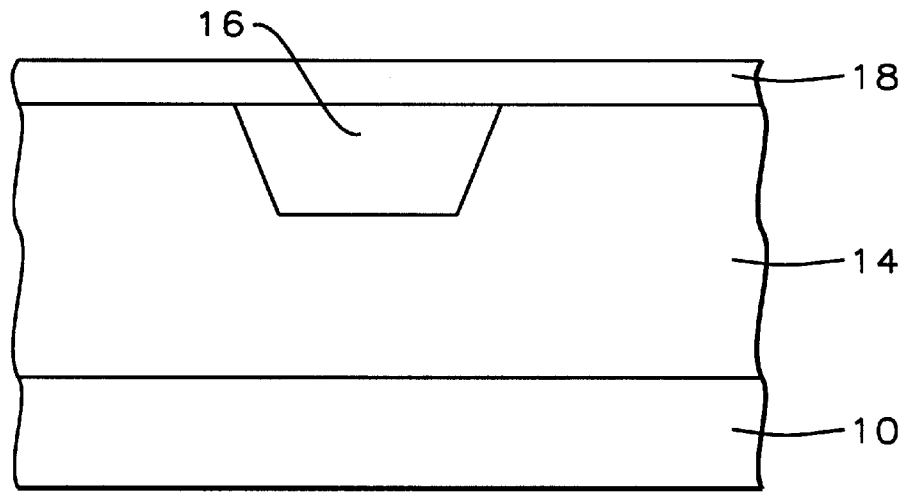

FIG. 6 shows a cross section of the deep n-well region of the semiconductor substrate of FIG. 5, the well oxide has been removed from the surface of the semiconductor substrate, a field oxide region 16 has been created within the semiconductor substrate and a layer 18 of sacrificial oxide has been deposited on the surface of the semiconductor substrate 10.

The layer of sacrificial oxide serves to prevent damage to the substrate during the LV n-well implant, the LV p-well implant and the buried p-well implant.

The layer of well oxide can be removed by an oxide buffer etch (using a HF solution). The field oxide is typically in excess of 0.1 um wide with a height of between about 2000 and 5000 Angstrom.

Figure 7:
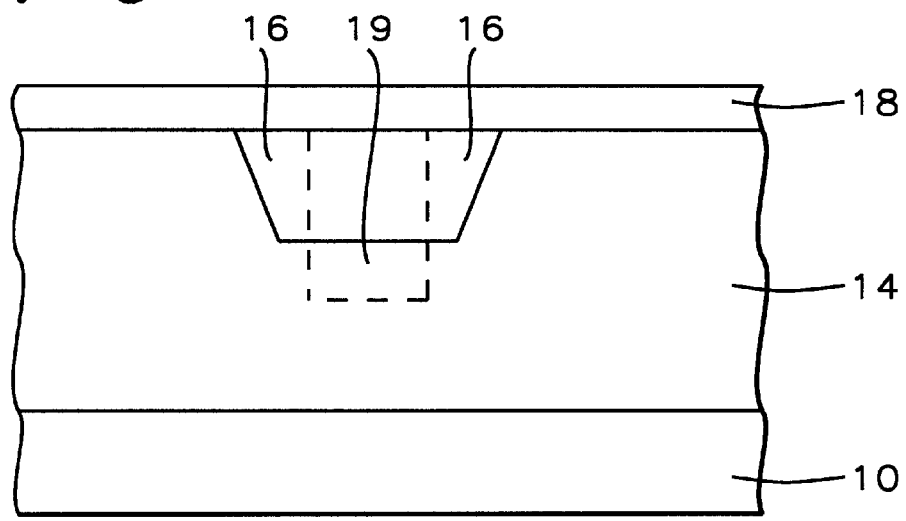

FIG. 7 shows a cross section of the deep n-well region of the semiconductor substrate of FIG. 6 after the low voltage n-well cluster implant 19 has been performed. It is apparent from the cross section that is shown in FIG. 7 that the low-voltage cluster implant 19 is aligned with the field oxide region 16. The impurity ions of the cluster implant 19 therefore essentially concentrate underneath the field oxide region 16.

The cluster process is used in this case to minimize particle contamination and to preserve the integrity of the device that is being processed. A wafer-handling tool passes the wafers from one processing tool to the next in a vacuum.

The LV n-well cluster implant processing conditions are typically as follows:

LV n-well implant:
   P or As energy: 300 to 600 keV
      dose: 1E13 to 5E14 atoms/cm$^2$
   P or As energy: 50 to 300 keV
      dose: 1E12 to 1E14 atoms/cm$^2$
   P or As energy: 10 to 200 keV
      dose: 1E12 to 1E14 atoms/cm$^2$.

The n-well region in a high voltage PMOS device is in the high voltage isolation region and is in dimension less than the high voltage isolation region forming the so-called pull-back structure.

Figure 8:
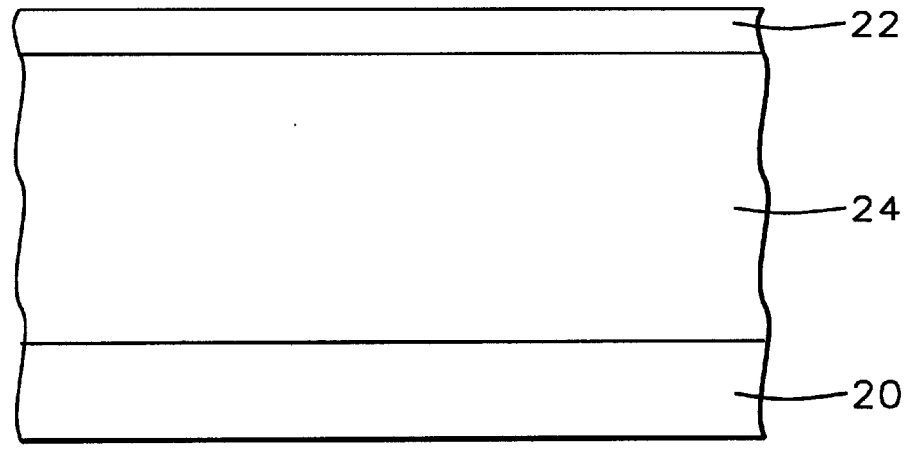
FIGS. 8 through 10 address the second embodiment of the invention, as follows.

FIG. 8 shows a cross section of the p-well region of a semiconductor substrate 20. A layer 22 of well oxide has been deposited on the surface of the semiconductor substrate 20, the location 24 of the deep n-well after the deep n-well implant and deep n-well drive-in have been performed on the semiconductor substrate has been indicated.

Typical deep n-well implant and deep n-well drive in processing conditions are as follows.
Deep n-well implant:
   P energy: 100 KeV to 5 MeV
      dose: 5E11 to 1E13 atoms/cm$^2$.
Deep n-well drive in: temperature between about 1000 and 1200 degrees C. for a time of between about 6 and 24 hours in an environment of N$_2$ gas.

Figure 9:
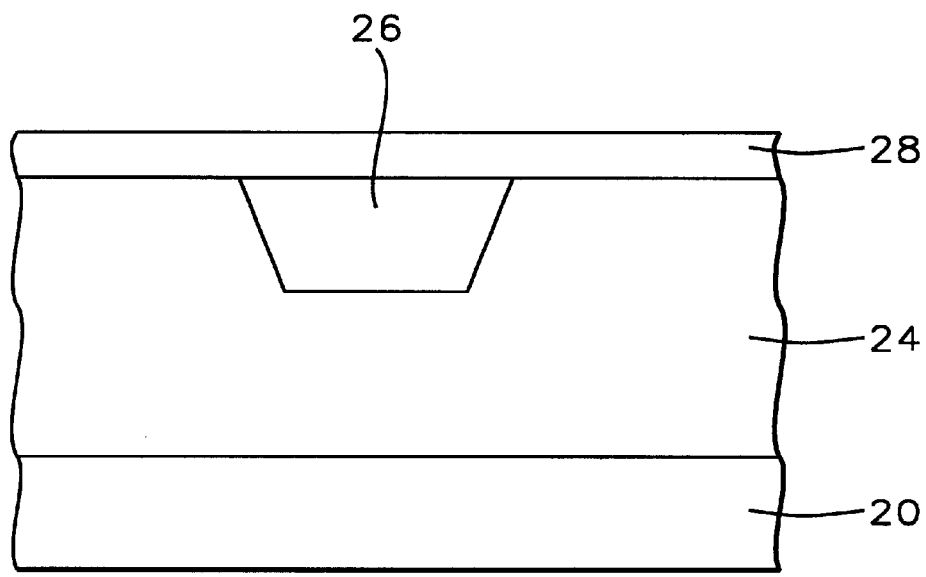

FIG. 9 shows a cross section of the deep n-well region of the semiconductor substrate of FIG. 8, the well oxide has been removed from the surface of the semiconductor substrate, a field oxide region 26 has been created within the semiconductor substrate and a layer 28 of sacrificial oxide has been deposited on the surface of the semiconductor substrate 20.

The layer of well oxide can be removed by an oxide buffer etch (using a HF solution).

The SAC oxide layer is deposited using LPCVD, PECVD, or APCVD processing, at a temperature between about 300 and 800 degrees C., to a thickness between about 200 and 5000 Angstrom.

Figure 10:
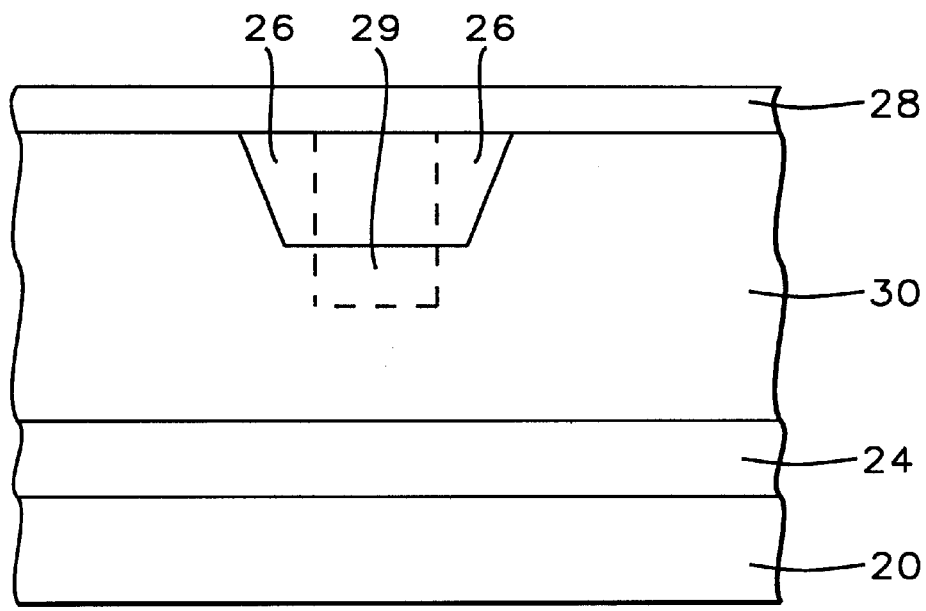

FIG. 10 shows a cross section of the buried p-well region of the semiconductor substrate of FIG. 9 after the low voltage p-well cluster implant 29 has been performed and after the buried p-well cluster implant 30 has been completed.

The processing conditions for the formation of the LV p-well cluster implant are typically as follows:
LV p-well implant:
   boron energy: 100 KeV to 320 KeV
      dose: 1E13 to 1E14 atoms/cm$^2$
   boron energy: 25 KeV to 140 KeV
      dose: 1E12 to 1E14 atoms/cm$^2$
   indium or boron energy: 1 KeV to 150 KeV
      dose: 1E12 to 1E14 atoms/cm$^2$.

In a high voltage NMOS device, the LV p-well is in the high voltage NMOS isolation region and has dimensions that are less than the dimensions of the NMOS high voltage isolation region, forming the so-called pull-back structure.

The processing conditions for the formation of the buried p-well cluster implant are typically as follows:
Buried p-well implant:
   boron energy: 400 KeV to 600 KeV
      dose: 5E12 to 1E14 atoms/cm$^2$
   boron energy: 150 KeV to 300 KeV
      dose: 1E12 to 1E14 atoms/cm$^2$
   boron energy: 40 KeV to 130 KeV
      dose: 1E12 to 5E13 atoms/cm$^2$
   boron energy: 5 KeV to 30 KeV
      dose: 5E11 to 5E12 atoms/cm$^2$.

The buried p-well cluster implant typically penetrates the entire high voltage NMOS region. It is clear from the cross section that is shown in FIG. 10 that the penetration of the low-voltage cluster implant 29 of the invention by contrast is aligned with the field oxide region 26. The impurity ions of the cluster implant 29 therefore essentially concentrate underneath the field oxide region 26.

The above figures and explanations illustrate that the invention introduces a low voltage region into a region of high voltage gradient, that is the region under the FOX layer. This low voltage region contracts or pushes back the field region and, in so doing, increases the high voltage breakdown characteristics of the isolation region. The low voltage area under the FOX region forms a thick and high dosage layer under the field oxide region and thereby improves both the field turn-on characteristics and the punch-through protection under the layer of field oxide.

From the foregoing it will be clear that, although a specific embodiment of the present invention has been described herein for purposes of illustration, various modifications to the present invention may be made without deviating from the spirit and scope of the present invention. Accordingly, the present invention is not limited except as by the appended claims.

What is claimed is:

1. A method is of creating field isolation regions within a semiconductor device, consisting of:
   providing a semiconductor substrate;
   depositing a layer of well oxide over the surface of said substrate;
   performing a deep n-well implant into the surface of an n-well region of said substrate;
   performing a deep n-well drive-in of said deep n-well implant;
   removing said layer of well oxide from the surface of said substrate;
   creating a layer of field oxide in said n-well region;
   depositing a layer of sacrificial oxide over the surface of said substrate; and
   performing a selective low-voltage n-well cluster implant into the field oxide region on the surface of said n-well region of said substrate.

2. The method of claim 1 wherein said depositing a layer of well oxide over the surface of said substrate is depositing a layer of silicon dioxide at a temperature between 800 and 1000 degrees C. to a thickness within the range of between 30 and 300 Angstrom.

3. The method of claim 1 wherein said depositing a layer of well oxide over the surface of said substrate is depositing a layer of composite oxide, such as TEOS and silicon dioxide, or a nitride oxide layer or a like gate dielectric at a temperature between 800 and 1000 degrees C. to a thickness within the range of between 30 and 300 Angstrom.

4. The method of claim 1 wherein said performing a deep n-well implant is implanting phosphorous with an energy of 100 to 500 keV and a dose of 5E11 to 1E13 atoms/$^2$.

5. The method of claim 1 wherein said performing a deep n-well drive-in is a thermal process within N$_2$ gas under a temperature of between about 1000 and 1200 degrees C. for a time between about 6 and 24 hours.

6. The method of claim 1 wherein said creating a layer of field oxide is creating a layer of field oxide within said substrate to a thickness within the range of between 500 and 900 nm thermally grown by wet oxidation at temperatures of 900 to 1000 degrees C. for 4 to 8 hours.

7. The method of claim 1 wherein said creating of a layer of field oxide is creating a layer of STI within said substrate to a thickness between about 300 and 700 nm.

8. The method of claim 1 wherein said depositing a layer of sacrificial oxide is depositing a layer of oxide to a thickness within the range of between about 15 and 50 nm.

9. The method of claim 1 wherein said performing a low-voltage n-well cluster implant is implanting phosphorous with an energy of between about 300 and 600 KeV and a dose between about 1E13 and 5E14 atoms/cm$^2$.

10. The method of claim 1 wherein performing a low-voltage n-well cluster implant is implanting phosphorous with an energy of between about 50 and 300 KeV and a dose between about 1E12 and 1E14 atoms/cm$^2$.

11. The method of claim 1 wherein performing a low-voltage n-well cluster implant is implanting phosphorous with an energy of between about 10 and 200 KeV and a dose between about 1E12 and 1E14 atoms/cm$^2$.

12. A method is of creating field isolation regions within a semiconductor device, consisting of:
   providing a semiconductor substrate;
   depositing a layer of well oxide over the surface of said substrate;
   performing a deep n-well implant into the surface of the high voltage NMOS region of said substrate;
   performing a deep n-well drive-in of said deep n-well implant;
   removing said layer of well oxide from the surface of said substrate;
   creating a layer of field oxide in said high voltage NMOS region;
   depositing a layer of sacrificial oxide over the surface of said substrate;
   performing a low-voltage p-well cluster implant into the surface of said isolation region of said high voltage NMOS region of said substrate; and
   performing a selective buried p-well cluster implant into the field oxide region on the surface of said high voltage NMOS region of said substrate.

13. The method of claim 12 wherein said depositing a layer of well oxide over the surface of said substrate is depositing a layer of silicon dioxide at a temperature between 800 and 1000 degrees C. to a thickness within the range of between 30 and 300 Angstrom.

14. The method of claim 12 wherein said depositing a layer of well oxide over the surface of said substrate is depositing a layer of composite oxide, such as TEOS and silicon dioxide, or a nitride oxide layer or a like gate dielectric at a temperature between 800 and 1000 degrees C. to a thickness within the range of between 30 and 300 Angstrom.

15. The method of claim 12 wherein said performing a deep n well implant is implanting phosphorous with an energy of 100 to 5000 keV and a dose of 5E11 to 1E13 atoms/cm$_2$.

16. The method of claim 12 wherein said performing a deep n-well drive-in is a thermal process in N$_2$ gas under a temperature between about 1000 and 1200 degrees C. for a time between about 6 and 24 hours.

17. The method of claim 12 wherein said creating a layer of field oxide is creating a layer of field oxide within said substrate to a thickness within the range of between 500 and 900 nm thermally grown by wet oxidation at temperatures of 900 to degrees C. for 4 to 8 hours.

18. The method of claim 12 wherein said creating a layer of field oxide is creating a layer of STI within said substrate to a thickness between about 300 and 700 nm.

19. The method of claim 12 wherein said depositing a layer of sacrificial oxide is depositing a layer of oxide to a thickness within the range of between about 15 and 50 nm.

20. The method of claim 12 wherein said performing a low voltage p-well cluster implant is a method selected from implanting boron with an energy of between about 100 and 300 KeV and a dose between about 1E13 and 1E14 atoms/cm$^2$ or implanting boron with an energy between about 25 and 140 KeV and a dose between about 1E12 and 1E14 atoms/cm$^2$ or implanting boron or indium with an energy between about 1 and 150 KeV and a dose between about 1E12 and 1E14 atoms/cm thereby forming a thick high dosage layer under said p-well field region thereby improving device turn-on characteristics thereby further improving device n-well punchthrough under said field oxide.

21. The method of claim 12 wherein said performing a buried p-well cluster implant is implanting boron with an energy of between about 400 and 600 KeV and a dose of between about 5E12 and 1E14 atoms/cm$^2$.

22. The method of claim 12 wherein said performing a buried p-well cluster implant is implanting boron with an energy of between about 150 and 300 KeV and a dose of between about 1E12 and 1E14 atoms/cm$^2$.

23. The method of claim 12 wherein said performing a buried p-well cluster implant is implanting boron with an energy of between about 40 and 130 KeV and a dose of between about 1E12 and 5E13 atoms/cm$^2$.

24. The method of claim 12 wherein said performing a buried p-well cluster implant is implanting boron with an energy of between about 5 and 30 KeV and a dose of between about 5E11 and 5E12 atoms/cm$^2$.

* * * * *